US008812999B2

(12) United States Patent
Liu et al.

(10) Patent No.: US 8,812,999 B2
(45) Date of Patent: Aug. 19, 2014

(54) METHOD AND SYSTEM OF MASK DATA PREPARATION FOR CURVILINEAR MASK PATTERNS FOR A DEVICE

(71) Applicant: Taiwan Semiconductor Manufacturing Co., Ltd., Hsin-Chu (TW)

(72) Inventors: Ru-Gun Liu, Zhubei (TW); Wen-Hao Cheng, Taichung (TW); Chih-Chiang Tu, Tauyen (TW); Shuo-Yen Chou, Ji-an Shiang (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/732,469

(22) Filed: Jan. 2, 2013

(65) Prior Publication Data

US 2014/0189614 A1    Jul. 3, 2014

(51) Int. Cl.
G06F 17/50    (2006.01)

(52) U.S. Cl.
USPC ............... 716/55; 716/50; 716/52; 716/53; 716/54; 716/56; 430/5; 430/30

(58) Field of Classification Search
USPC ............................ 716/50–56; 430/5, 30
See application file for complete search history.

(56) References Cited

U.S. PATENT DOCUMENTS

| 7,178,127 | B2 | 2/2007 | Abrams et al. |
| 7,799,489 | B2 | 9/2010 | Fujimura et al. |
| 2008/0141212 | A1* | 6/2008 | Haffner ..................... 716/21 |
| 2009/0013303 | A1 | 1/2009 | Hwang et al. |
| 2011/0045409 | A1* | 2/2011 | Fujimura ..................... 430/296 |
| 2011/0278731 | A1* | 11/2011 | Fujimura et al. ............ 257/774 |
| 2012/0034554 | A1* | 2/2012 | Fujimura et al. .............. 430/5 |
| 2012/0084740 | A1* | 4/2012 | Fujimura et al. .............. 716/53 |
| 2012/0094219 | A1* | 4/2012 | Fujimura et al. .............. 430/5 |
| 2012/0217421 | A1* | 8/2012 | Fujimura et al. .......... 250/492.3 |
| 2012/0219886 | A1* | 8/2012 | Fujimura et al. .............. 430/5 |
| 2012/0278770 | A1* | 11/2012 | Fujimura et al. .............. 716/53 |
| 2013/0034807 | A1* | 2/2013 | Fujimura et al. .............. 430/5 |
| 2013/0122406 | A1* | 5/2013 | Fujimura et al. .............. 430/5 |

OTHER PUBLICATIONS

Fujimura, A. et al., "Best depth of focus on 22 nm logic wafers with less shot count", Photomask and Next-Generation Lithography Mask Technology XVII. Edited by Kunihiro Hosono, Proceedings of the SPIE, 2010, 7748:77480V-77480V-9.

Kim, B.G. et al., "Trade-off between Inverse Lithography Mask Complexity and Lithographic Performance", Photomask and Next-Generation Lithography Mask Technology XVI. Edited by Kunihiro Hosono, Proc. of SPIE, 2009, 7379:73791M-1-11.

Chua, G.S. et al., "Optimization of mask shot count using MB-MDP and lithography simulation", Photomask, Bacus News, Nov. 2011, 27(11):1-12.

* cited by examiner

*Primary Examiner* — Nha Nguyen
(74) *Attorney, Agent, or Firm* — Duane Morris LLP; Steven E. Koffs

(57) ABSTRACT

A method comprises: (a) transforming a layout of a layer of an integrated circuit (IC) or micro electro-mechanical system (MEMS) to a curvilinear mask layout; (b) replacing at least one pattern of the curvilinear mask layout with a previously stored fracturing template having approximately the same shape as the pattern, to form a fractured IC or MEMS layout; and (c) storing, in a non-transitory storage medium, an e-beam generation file including a representation of the fractured IC or MEMS layout, to be used for fabricating a photomask.

19 Claims, 13 Drawing Sheets

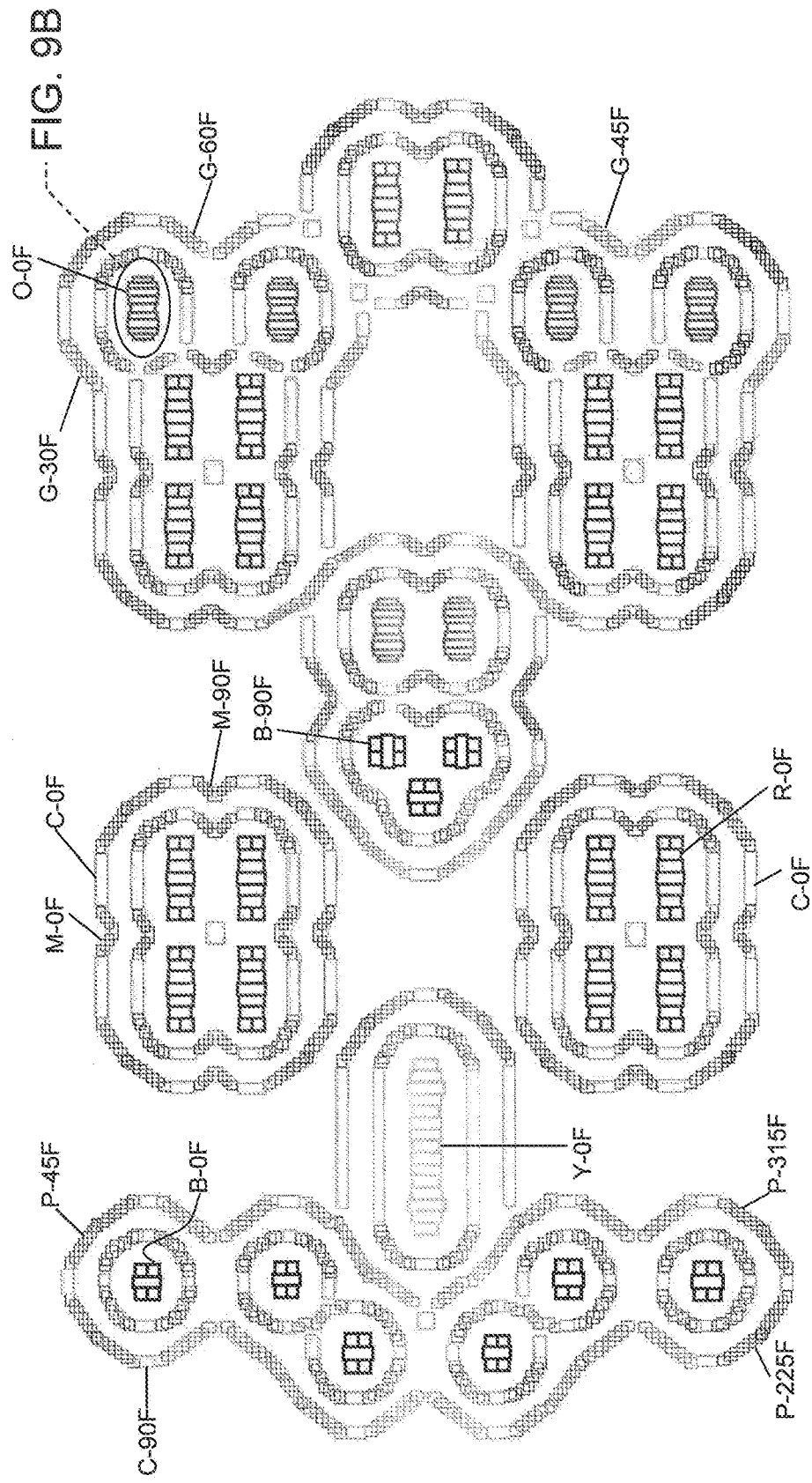

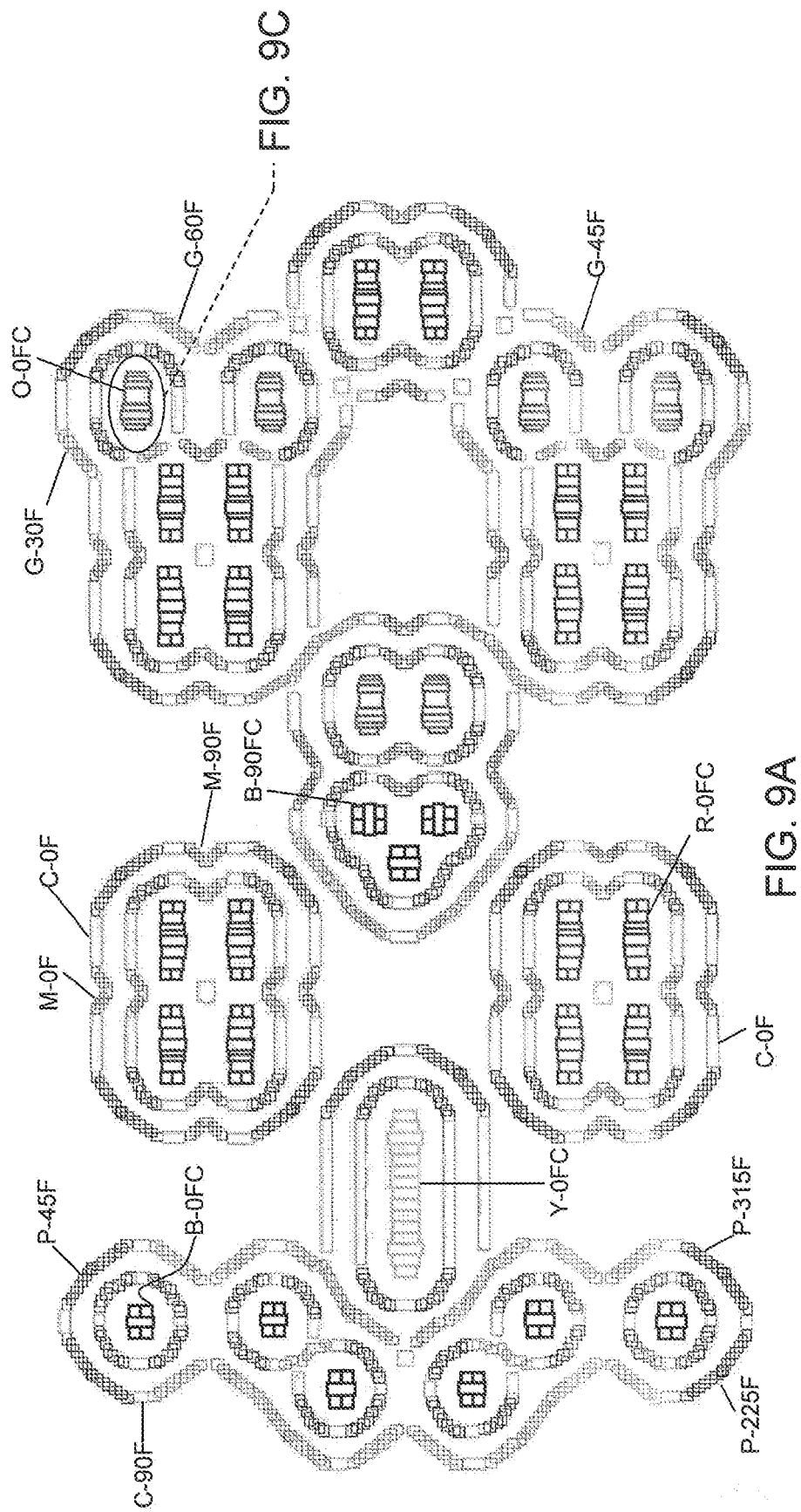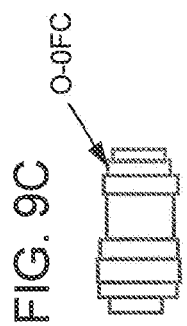

METHOD AND SYSTEM OF MASK DATA PREPARATION FOR CURVILINEAR MASK PATTERNS FOR A DEVICE

FIELD

This disclosure relates to electronic design automation tools

BACKGROUND

In the electronics industry, the size of devices, including integrated circuits (IC) and micro electro-mechanical systems (MEMS), continues to shrink to reduce footprint and power consumption. For technologies having a critical dimension smaller than 45 nanometers (nm), as integrated circuit critical dimension is reduced and its circuit density increases, the minimum separation distance between adjacent lines approaches the resolution limit of the 193 nm optical exposure tools used in optical lithography. Due to high capital costs, it is desirable to continue using previously purchased lithography tools. Thus, compensation techniques, such as optical proximity correction (OPC) have been developed. OPC alters the photomask design to compensate for distortions caused by diffraction and produce circuit patterns in the substrate which more closely conform to the IC designer's layout.

Computational Lithography techniques are being developed to calculate appropriate photomask shapes to for producing desired features on a wafer. For example inverse lithography technology (ILT) mathematically derives optimal mask shapes for a particular light source and circuit pattern shape. Sub-resolution model based assist features (hereinafter, "assist features") can be added to the photomask, to improve the accuracy of the circuit pattern on the wafer. Because of the diffraction effects, these assist features are not patterned on the semiconductor wafer itself. Source mask optimization (SMO) optimizes the light source of critical design parts and appropriate OPC for that light source is performed. These techniques result in a mask design having curvilinear mask patterns.

To prepare the curvilinear mask patterns for forming the photomask using an e-beam writer, the patterns are "fractured" into sequences of rectangles or triangles. For example, to form a horizontal or vertical line, a sequence of abutting rectangles is formed. To form a diagonal line, a sequence of overlapping rectangles is provided. This process is referred to as "Manhattanization." The rectangles may then be further fractured into smaller abutting rectangles. The Manhattanization/fracturing process involves a long computer execution time.

BRIEF DESCRIPTION OF THE DRAWINGS

FIG. 8 shows the layout of FIG. 5, with each component replaced by a corresponding fracturing template.

FIG. 9A shows the layout of FIG. 8, after application of mask process correction and optical proximity correction.

FIGS. 9B and 9C are enlarged details of a main pattern in FIGS. 8 and 9, before and after mask process correction and optical proximity correction, respectively.

DETAILED DESCRIPTION

This description of the exemplary embodiments is intended to be read in connection with the accompanying drawings, which are to be considered part of the entire written description.

An efficient and accurate curvilinear mask data preparation system and method are provided for the implementation of ILT, assist features, SMO, or any other advanced micro-patterning technology which use serpentine and/or complex mask patterns for fabricating a device, such as an IC or MEMS. Although detailed examples are described below for circuit patterns for an IC, the methods described below can also be applied to mask preparation for patterning other devices such as MEMS.

Curvilinear mask patterns can be Manhattanized first to fit in with current mask data preparation flows. The system described herein alleviates increase in design-to-mask cycle time due to the extra Manhattanization operation, and also reduces mask pattern fidelity loss and lithographic performance degradation.

Figure 2:
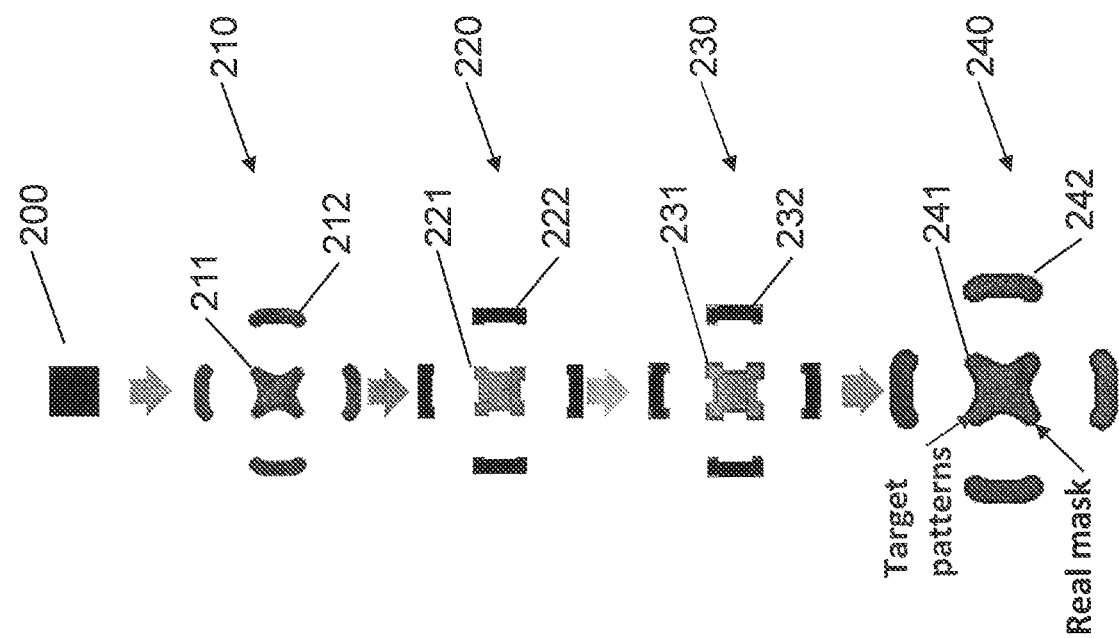
FIG. 2 is a diagram showing stages of transformation between a circuit (contact) pattern and photomask patterns.

FIG. 2 shows a serpentine/curvilinear mask data preparation flow for a single circuit pattern 200, which may be a square contact or conductive via, according to the IC designer's design. This is just one example, and similar preparation flows are performed for other types of patterns, such as conductive lines or diffusion regions.

Pattern 200 is a pattern to be formed in a layer of an IC.

Pattern 210 is an ideal curvilinear mask pattern generated by an ILT method. The pattern includes a main pattern 211 and assist features 212 which are optimized for the light source to pattern the photoresist on a substrate to form the square pattern 200. As noted above, the main pattern 211 corresponds to circuit pattern 200 to be patterned on a layer of an IC. The assist features 212 correspond to patterns to be formed on a photomask used to form the layer of the IC, but the assist features 212 are not to be patterned on the layer of the IC.

Pattern 220 shows the ideal pattern 210 after substituting a plurality of previously stored fracturing templates for the main pattern and the assist features. Each fracturing template is a previously defined set of one or more abutting rectangles that alone or in combination approximate an ideal curvilinear mask pattern. The "X" shaped main pattern 211 is approximated by a plurality of abutting rectangles, and each curved assist feature 212 is approximated by a plurality of abutting rectangles. By simply substituting a previously defined fracturing template instead of performing the computations to Manhattanize/fracture the ideal pattern, the speed of curvilinear mask data preparation is greatly improved.

Patterns 230 shows the layout portion 220 after mask process compensation (MPC) and OPC. Both the main pattern 231 and the assist features 232 can be altered in this procedure.

Pattern 240 shows the patterns formed on the photomask. In pattern 240, the outline represents the actual pattern 240 formed on the photomask. The shaded region represents the ideal curvilinear pattern 210, superimposed on the outline of the actual pattern 240. Both the main pattern 241 and assist features 242 of the actual pattern 240 very closely coincide with the ideal curvilinear pattern 210.

Figure 1:
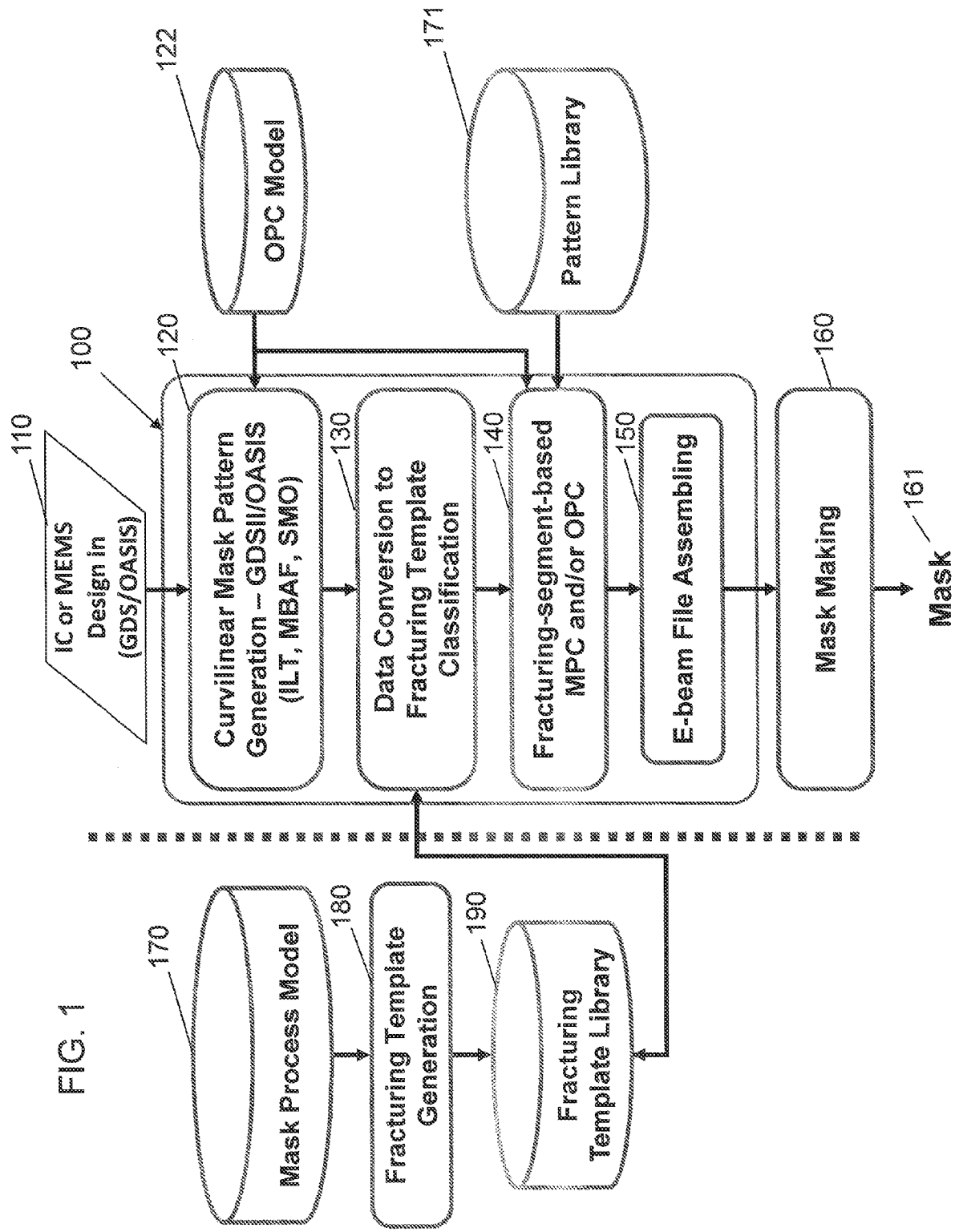
FIG. 1 is a diagram of one embodiment of a method for mask data preparation for curvilinear mask pattern generation.

FIG. 1 is a diagram of a method for curvilinear mask data preparation. The flow can be performed using a computer based EDA system 100.

Block 110 is a layout design provided by an IC designer. For example, the layout design can be embodied in a non-transitory machine readable storage medium encoded with data representing a plurality of circuit patterns in GDS II or OASIS format. The layout is provided with horizontal and/or vertical patterns.

Block 120 is a computer implemented system, which can be a computer programmed with an electronic design automation (EDA) tool having a computational lithography platform, such as "INVERSE EXPLORER" by SYNOPSYS of Mountain View, Calif., including inverse lithography technology (ILT), model based assist features, and Source Mask Optimization (SMO), or another tool having similar capabilities. Block 120 also receives as inputs the OPC model for the exposure tool to be used. Block 120 transforms the layout 110 of the layer of the IC to a curvilinear mask layout. The output of block 120 is a set of ideal curvilinear patterns which should produce the ideal target on the wafer. The system 120 can be implemented using a single computer processor, or the various functions can be distributed among plural computer processors.

Block 130 is a converter that converts the ideal curvilinear patterns to a set of fracture templates. Block 130 includes two main components: (1) a matching component for recognizing and classifying segments of patterns as being approximately the same as respective previously defined fracturing templates stored in a fracturing template library 190; and (2) a substitution component for replacing patterns of the curvilinear mask layout with one or more previously stored fracturing template having approximately the same shape as the patterns, to form a fractured IC layout.

The converter 130 replaces each respective one of the plurality of the assist features of the curvilinear mask layout with one or more fracturing templates so as to provide approximately the same shape as the respective assist feature of the curvilinear mask layout. In some embodiments, the converter 130 also replaces each respective one of the plurality of main patterns of the curvilinear mask layout with one or more fracturing templates so as to provide approximately the same shape as the respective main pattern of the curvilinear mask layout.

FIG. 1 also shows the fracturing template library 190 and its formation flow. The fracturing template library population begins with the mask process model 170 and pattern library 171.

At step 180, a set of elemental features are parsed from the pattern library. The set of features can have different function, shape, angle, length, position and neighbor projection. For each feature, Manhattanization and fracturing are performed to provide a fracturing template. The Manhattanization and fracturing can be performed using the capabilities of the computational lithography platform. The results of the Manhattanization and fracturing for each feature are stored in a reusable, modular fracturing template.

Figure 7:
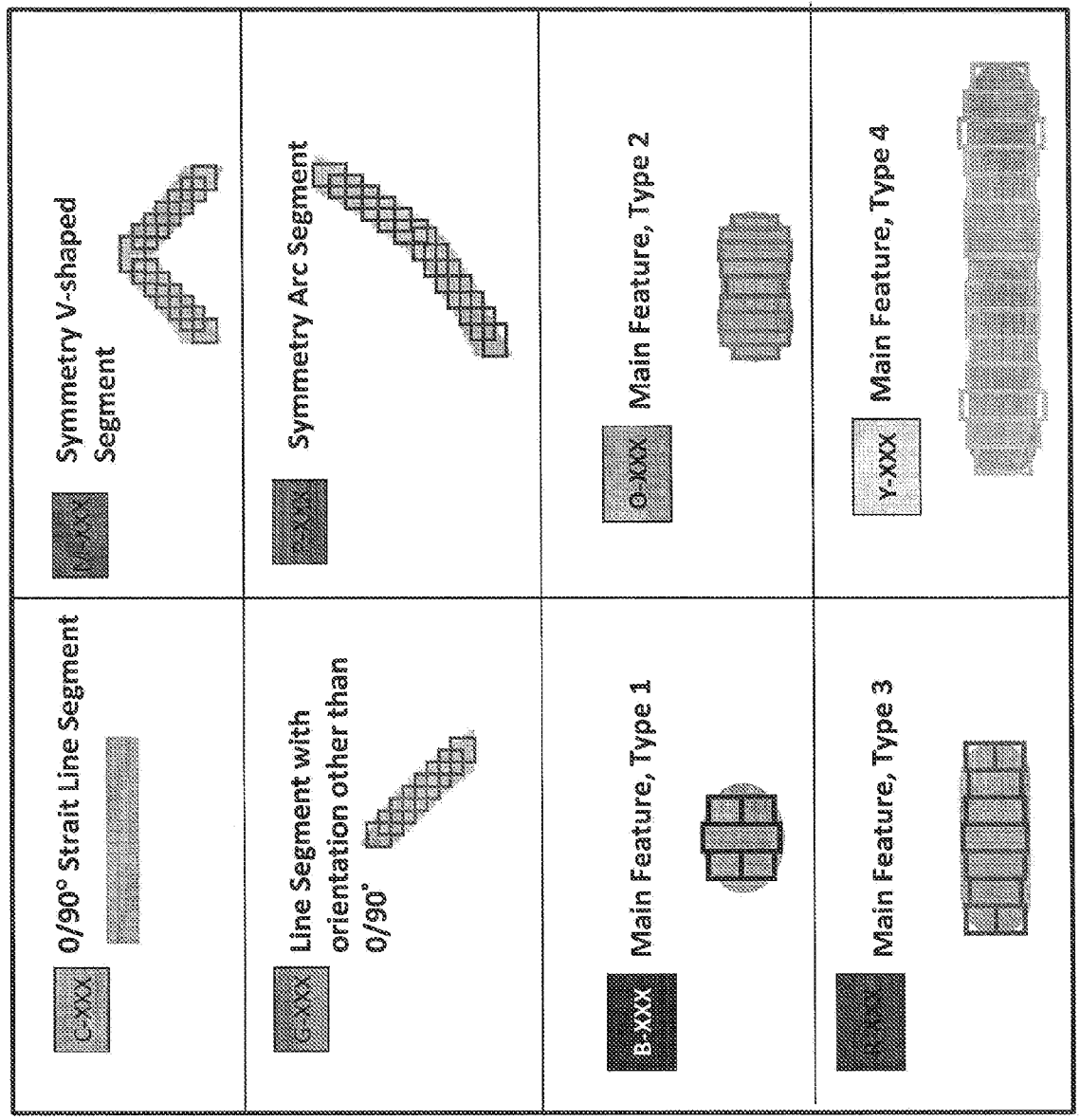
FIG. 7 is a table showing the type level classifications of the indexing structure of FIG. 6.

FIG. 7 shows an example of a set of elemental features. The elemental features in the fracturing template library 190 include main patterns designated B-XXX, O-XXX, R-XXX, and Y-XXX, and assist features designated C-XXX, G-XXX, M-XXX and P-XXX. Each ideal curvilinear mask pattern segment is shown by shading, and the approximating fractured pattern representation is indicated by the outline overlaid on the shaded segment. In FIG. 7, "XXX" is a number from 0 to 360, representing a rotational angle of a feature. The letters B, O, R, Y, C, G, M, and P represent different colors used to display each respective fracturing template on a display device.

Features designated C-XXX represent horizontal or vertical lines, C-0 and C-90, respectively. In some embodiments, fracture patterns designated C-XXX are displayed as cyan colored.

Features designated M-XXX represent symmetrical V-shaped segments, oriented in a variety of angles, (e.g., 45, 135, 225 and 315 degrees). In some embodiments, fracture patterns designated M-XXX are displayed as magenta colored.

Features designated G-XXX represent line segments which are neither horizontal nor vertical. Segments designated G-XXX can be oriented in a variety of angles, (e.g., 32, 45, . . . , 102 and 315 degrees). In some embodiments, fracture patterns designated G-XXX are displayed as green colored.

Features designated P-XXX represent symmetrical arc segments. Segments designated P-XXX can be oriented in a variety of angles, (e.g., 45, 135, 225 and 315 degrees). In some embodiments, fracture patterns designated P-XXX are displayed as purple colored.

Features designated B-XXX represent main pattern features, type 1 (e.g., ellipses). Features designated B-XXX can be oriented in a variety of angles, (e.g., 0, 45 and 90 degrees). In some embodiments, fracture patterns designated B-XXX are displayed as blue colored.

Features designated O-XXX represent main pattern features, type 2 (e.g., short line segments). Features designated O-XXX can be oriented in a variety of angles, (e.g., 0 and 90 degrees). In some embodiments, fracture patterns designated O-XXX are displayed as orange colored.

Features designated R-XXX represent main pattern features, type 3 (e.g., medium line segments). Features designated R-XXX can be oriented in a variety of angles, (e.g., 0 and 90 degrees). In some embodiments, fracture patterns designated R-XXX are displayed as red colored.

Features designated Y-XXX represent main pattern features, type 4 (e.g., long line segments). Features designated Y-XXX can be oriented in a variety of angles, (e.g., 0 and 90 degrees). In some embodiments, fracture patterns designated Y-XXX are displayed as yellow colored.

The fracturing template library database 190 includes a small set of abstract feature types to compose all possible curvilinear mask patterns. The plurality of fracturing templates are stored in a fracturing template library 190. Using the fracturing templates is then a matter of comparing the pattern to a plurality of previously stored fracturing templates stored in a fracturing template library; and selecting one or more of the plurality of previously stored fracturing templates which, alone or in combination, most closely resembles the pattern, to be used to replace the pattern.

FIG. 7 is just one example of a feature set. One of ordinary skill can determine other feature sets which can be used in various combinations to represent all of the main patterns and assist features in a photomask The fracturing template library 190 can be generated by fracturing method, overlapped shot method, or any other advanced mask data preparation method.

Figure 6:
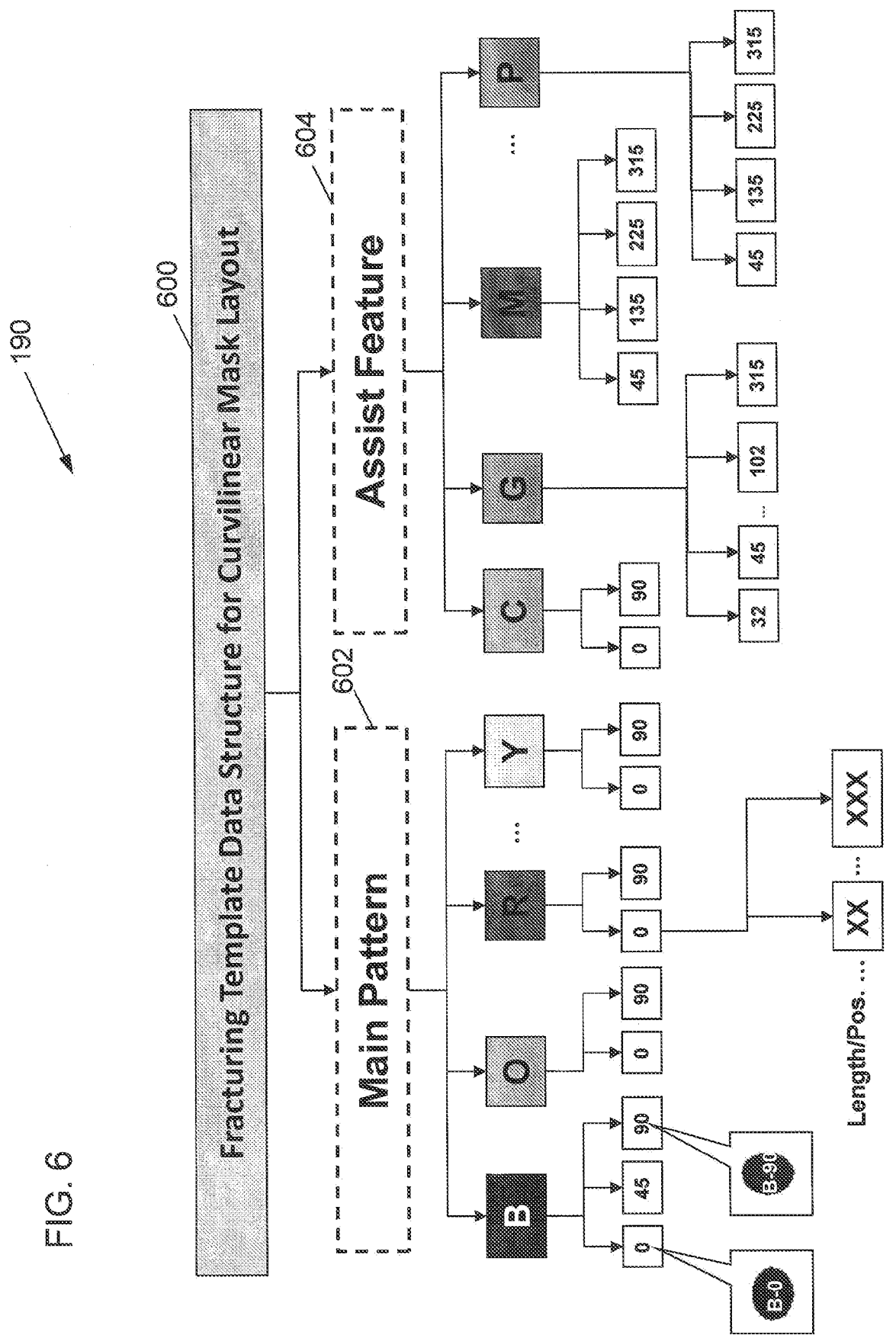
FIG. 6 shows a hierarchical indexing structure for a fracturing template library.

FIG. 6 shows a fracturing template data structure 600 for a curvilinear mask layout. This data structure can be used to index, store and retrieve fracturing template data. In the example, the organization is hierarchical.

The fracturing templates are divided into two top level classifications: main patterns 602 and assist features 604. The next level of the hierarchy (index) include pattern types. For the main patterns 602 the pattern types include B-XXX, O-XXX, R-XXX, and Y-XXX, and for the assist features 604 the pattern types include C-XXX, G-XXX, M-XXX and P-XXX. In the next level of the index, for each pattern type, one or more angles are specified. In some embodiments the angle level contains the leaves of the index, which point to individual fracturing templates. In other embodiments, one or more additional level(s) is (are) provided, to specify pattern length and/or position and/or neighbor projection.

Figure 13B:
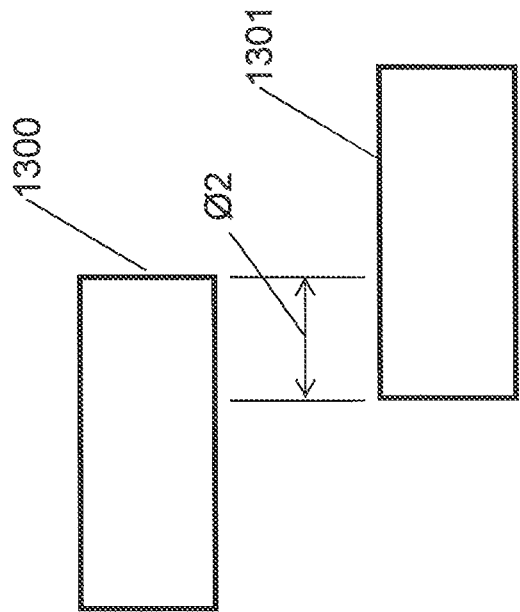
FIGS. 13A and 13B are diagrams showing projection length.
Figure 13A:
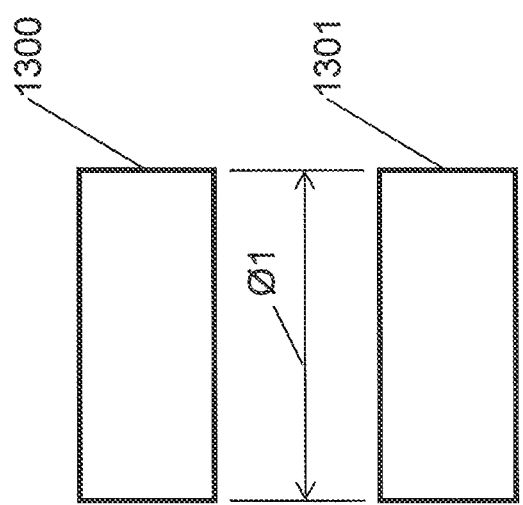

FIGS. 13A and 13B demonstrate the neighbor projection concept. In FIGS. 13A and 13B, each figure has the same two patterns 1300, 1301 separated by the same perpendicular distance. However, the projection length Ø1 in FIG. 13A is different from the projection length Ø2 in FIG. 13B. The presence of patterns with varying projection lengths can make the use of different fracturing templates advantageous in some embodiments.

Referring again to FIG. 6, the index 190 provides a convenient tool for matching an ideal curvilinear mask pattern against individual fracturing templates.

A decision tree can be used to select the appropriate fracturing template for each segment of an ideal curvilinear mask pattern. First, a determination is made whether the segment is a main pattern or an assist feature. If the segment is a main pattern, then a determination is made whether the pattern is B-XXX, O-XXX, R-XXX, or Y-XXX. Then the angle of the pattern is determined, to identify the leaf which points to the appropriate fracturing pattern. If the segment is an assist feature (or part thereof), then a determination is made whether the pattern is C-XXX, G-XXX, M-XXX, or P-XXX. Then the angle of the pattern is determined, to identify the leaf which points to the appropriate fracturing pattern.

When inserting the fracturing template to curvilinear mask layout, system can automatically adjust the size and number of rectangles for best pattern matching.

Because all of the computation work for Manhattanizing/fracturing the pattern in the fracturing template was previously performed by the fracturing template generation process 180, there is no need to perform the computationally intensive Manhattanizing/fracturing for each individual pattern or pattern component.

Referring again to FIG. 1, after substituting the fracturing templates for the ideal curvilinear mask patterns, block 140 performs fracturing segment based MPC and/or OPC, using the OPC model 122 and mask process model 170. If the original fracturing template is used without any MPC/OPC, the patterns can be exposed to a variety of different neighboring pattern and light source environments for different mask making environments. So, in some cases, if a fracturing template is used without any MPC/OPC, small variations can occur. Thus, in some embodiments, OPC and/or MPC operations are performed to ensure that even stringent mask specifications are met. During either or both of these corrections some small modifications can be made to the fracturing template patterns and then this corrected data can be used as the mask data for mask writing.

Block 150 assembles the e-beam file for fabricating a photomask using an e-beam writer, such as a variable shaped beam (VSB) writer.

Block 160 is formation of a photomask 161 using an e-beam writer.

FIGS. 3-5 and 8-9C show an example of method for using the fracturing template library 190.

Figure 3:
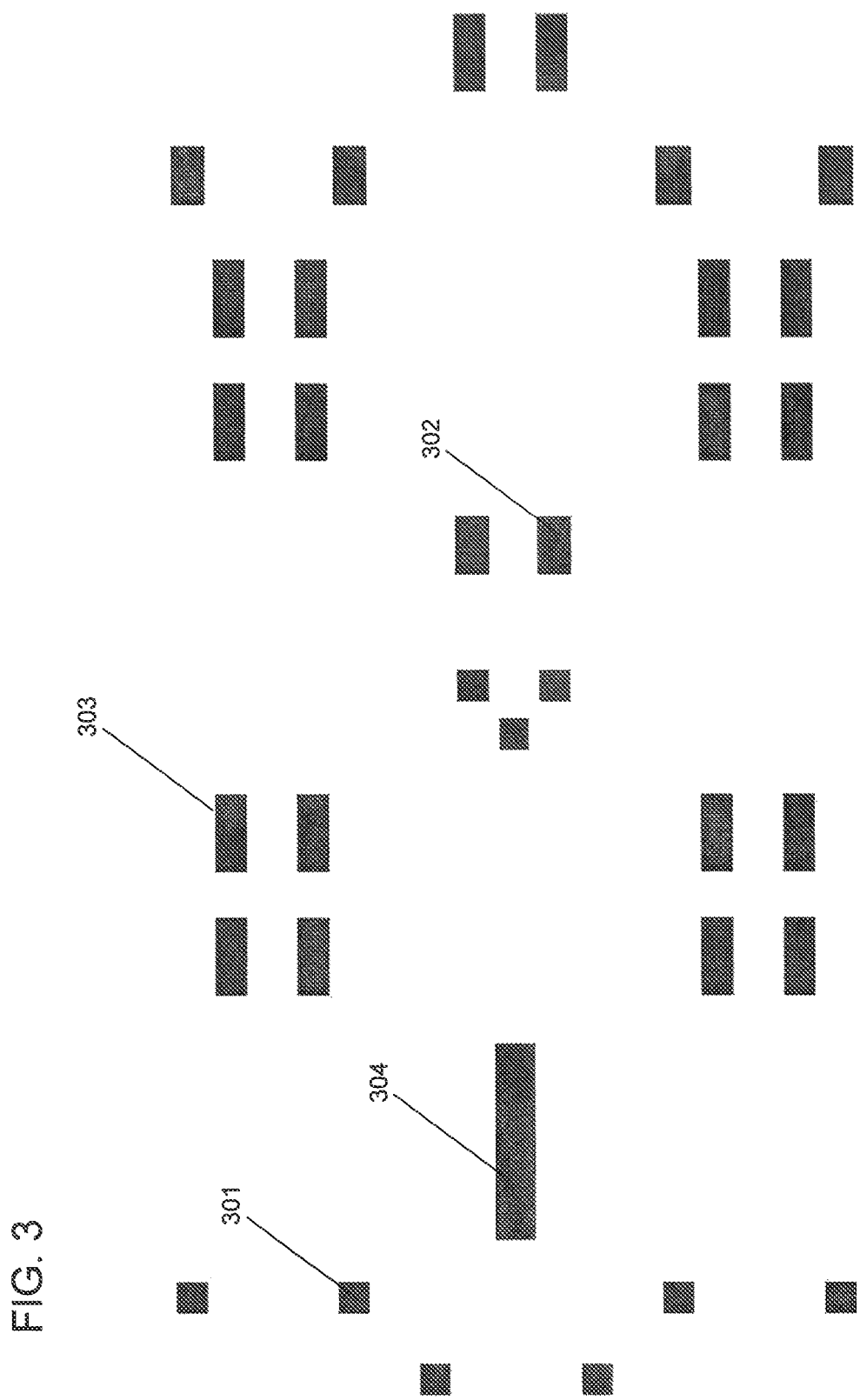
FIG. 3 is a diagram of an example of a layout of a layer of an IC.

FIG. 3 shows an example of a target pattern 300 to be formed on a semiconductor wafer. Such a pattern can serve as the input design 110 of FIG. 1. The example pattern 300 includes vias 301, short trenches 302, medium trenches 303 and long trenches 304.

Figure 4:
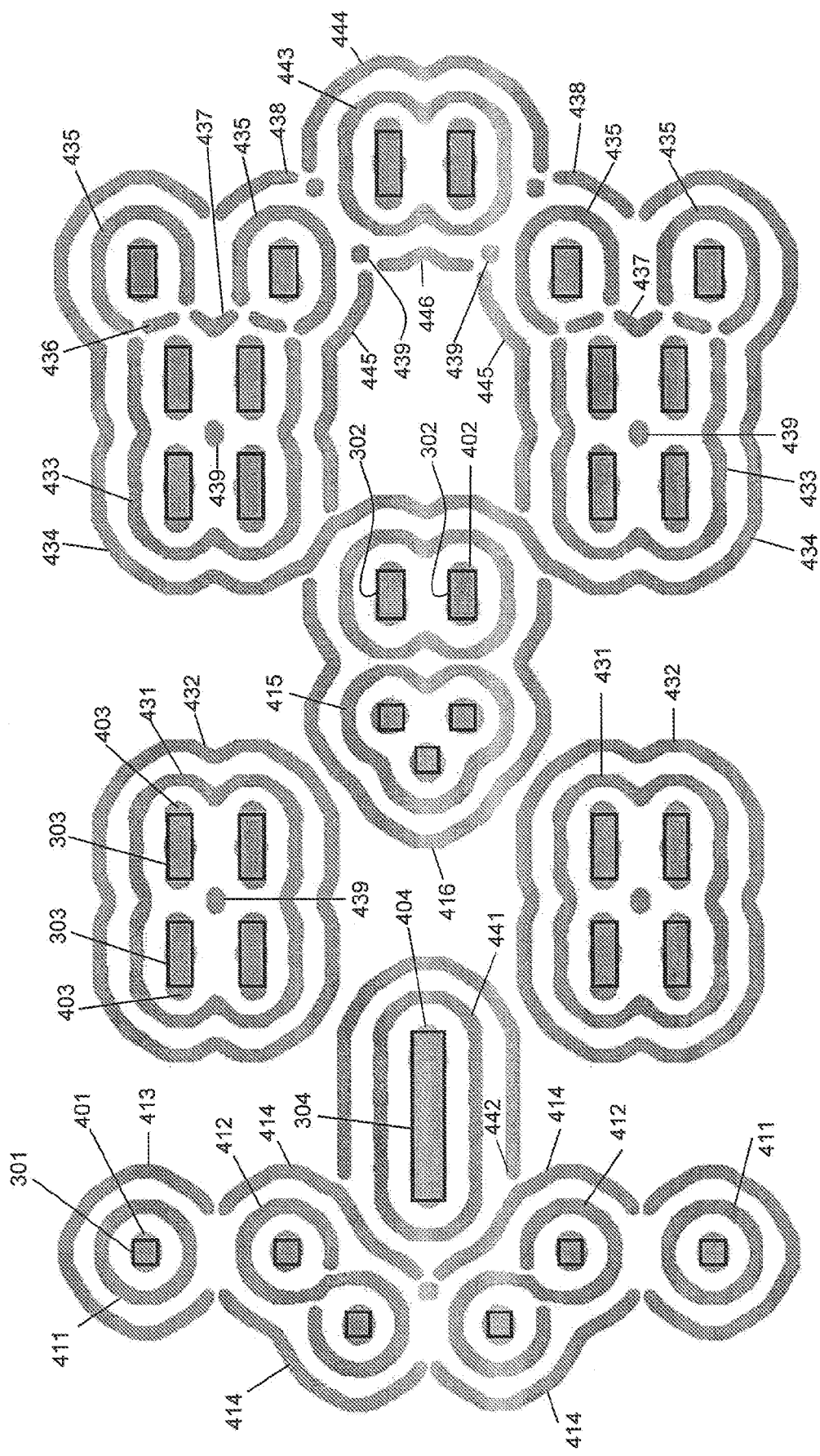
FIG. 4 shows a curvilinear mask pattern layout corresponding to the layout of FIG. 3.

FIG. 4 shows an ideal curvilinear mask pattern corresponding to the pattern 300. The ideal curvilinear mask is output from block 120 of FIG. 1. The ideal curvilinear mask pattern is shown by shaded regions, and the target pattern 300 is shown in outline form, superimposed on the ideal curvilinear mask pattern. The outlines of the main patterns 301-304 are superimposed on the shaded main patterns 401-404. In addition, several assist features 411-416 and 431-446 are added.

Figure 5:
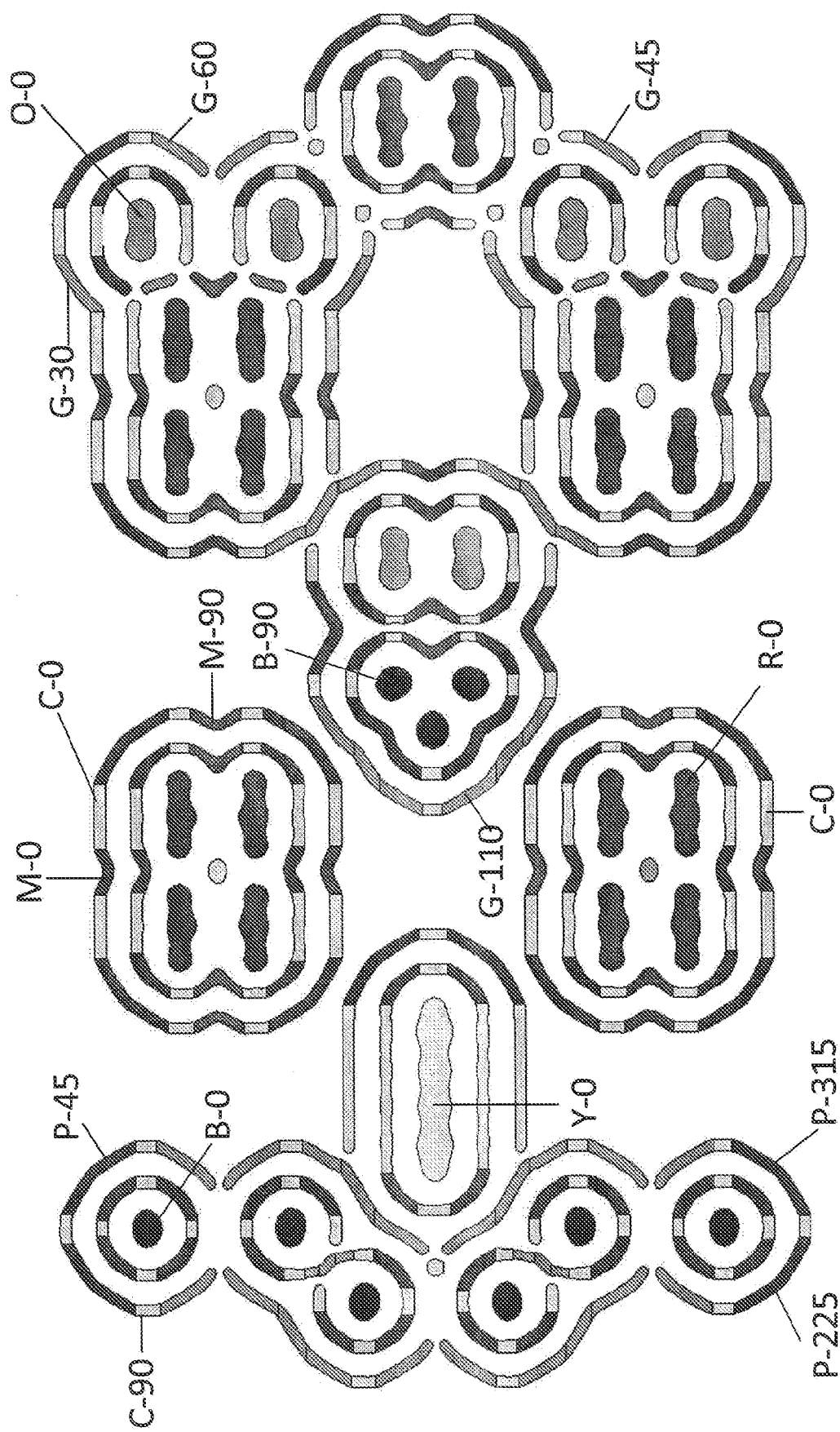
FIG. 5 shows the layout of FIG. 4, decomposed into components.

FIG. 5 shows the result of the matching process. Various segments of the main patterns and assist features of FIG. 4 are matched against the fracturing template library. This can be achieved by traversing an index of the type shown in FIG. 6. In FIG. 5, various fracturing template identifiers are indicated as labels for the various pattern types included in the ideal curvilinear mask pattern. In some embodiments, once the fracturing template types and angles are all identified, the pattern is displayed with each segment shown in its corresponding color, as described with reference to FIG. 7.

FIG. 8 shows the pattern output from block 130 after each pattern segment is replaced by its corresponding fracturing template.

FIG. 9A shows the pattern output from block 140, after fracturing segment based MPC and OPC are performed. FIGS. 9B and 9C show enlarged details of the same pattern O-OF (FIG. 9B), before MPC and OPC and O-OFC after MPC and OPC. The small adjustments to the fracturing template patterns reflect the actual neighboring pattern environments and light source environments to be used in the mask making process.

Figure 10:
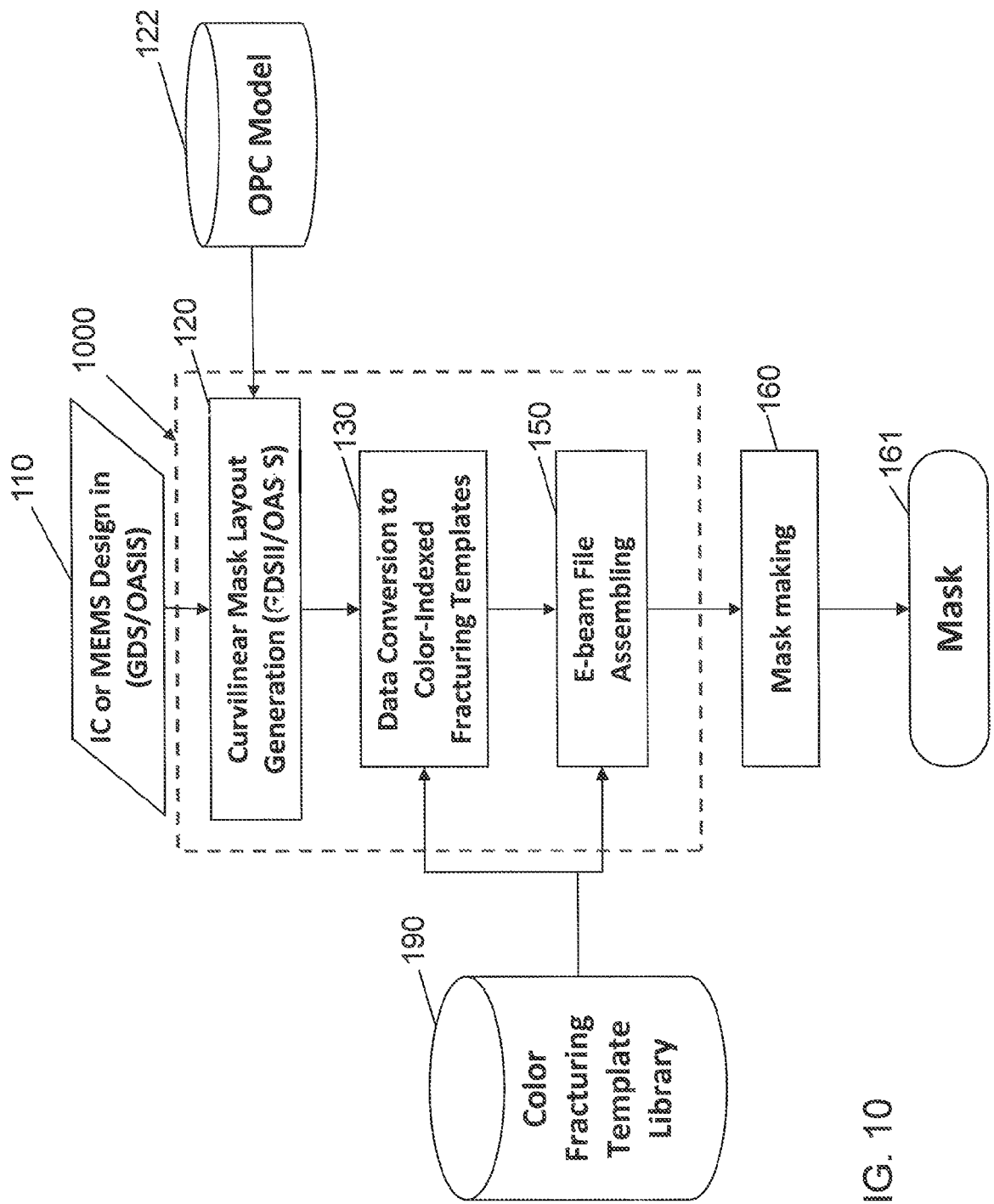
FIG. 10 is a diagram of a second process flow of the method.

FIG. 10 shows another alternative flow used in some embodiments. The flow of FIG. 10 is intended to be faster than the flow of FIG. 1, and can be performed with the same apparatus, by turning off the fracturing segment based MPC/OPC block 140. The other blocks of FIG. 10 can be the same as shown in FIG. 1. In alternative embodiments, the flow of FIG. 10 can be performed using a system 1000 which does not include the fracturing segment based MPC/OPC block 140. This flow provides fast template-based curvilinear mask data preparation without performing individual fracturing computations or MPC/OPC computations for each pattern or pattern segment. Thus, the flow of FIG. 10 can be performed more quickly, while the flow of FIG. 1 can provide greater mask accuracy.

Block 110 is the layout design provided by an IC designer. For example, the layout design can be embodied in a non-transitory machine readable storage medium encoded with data representing a plurality of circuit patterns in GDS II or OASIS format.

Block 120 is a computer implemented system, which can be a computer programmed with an EDA tool having a computational lithography platform, such as "INVERSE EXPLORER" by SYNOPSYS of Mountain View, Calif. Block 120 transforms the layout 110 of the layer of the IC to a curvilinear mask layout. The output of block 120 is a set of ideal curvilinear patterns which should produce the ideal target on the wafer.

Block 130 is a converter that converts the ideal curvilinear patterns to a set of fracture templates. Block 130 includes two main components: (1) a matching component for recognizing and classifying segments of patterns as being approximately the same as respective previously defined fracturing templates stored in a fracturing template library 190; and (2) a substitution component for replacing patterns of the curvilinear mask layout with one or more previously stored fracturing template having approximately the same shape as the patterns, to form a fractured IC layout.

Block 150 assembles the e-beam file for fabricating a photomask using an e-beam writer, such as a variable shaped beam (VSB) writer. The e-beam generation file including a representation of the fractured IC layout, to be used for fabricating a photomask, is stored in a non-transitory storage medium.

Block 160 is formation of a photomask 161 using an e-beam writer.

Figure 11:
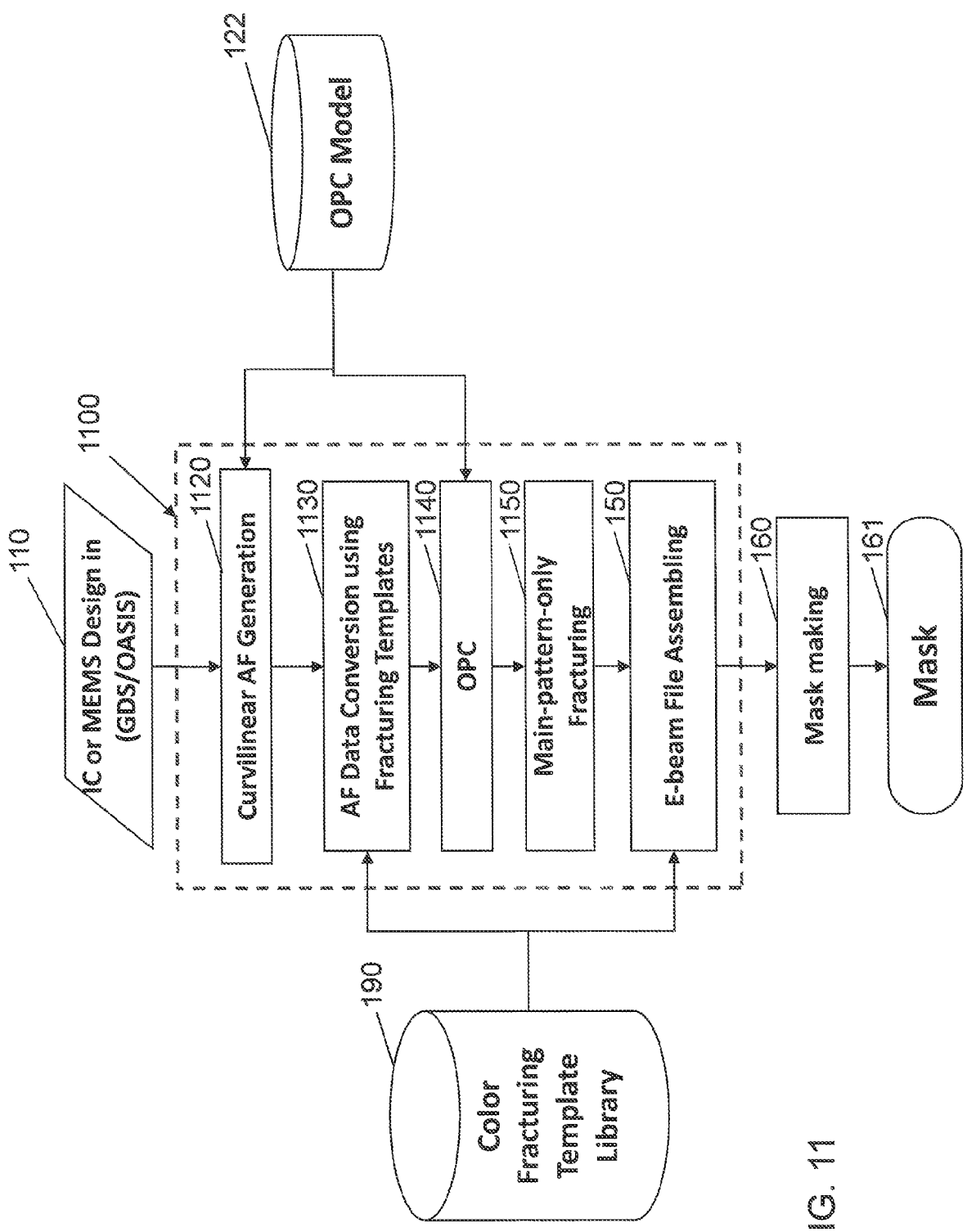
FIG. 11 is a diagram of a third process flow of the method.

FIG. 11 shows another alternative flow used in some embodiments. The flow of FIG. 11 uses the fracturing templates for the assist features, in the same manner described above with reference to the flow of FIG. 1, and uses full Manhattanization and fracturing techniques for the main patterns. Such a flow can be advantageous if the main patterns are very complex, for example, or if the existing template library does not have fracturing templates closely resembling all of the patterns in the ideal curvilinear mask data for a particular IC. The flow of FIG. 11 can be performed with a similar apparatus to that described with reference to FIG. 1, with an added decision block which determines whether each circuit pattern is a main pattern or an assist feature. If the pattern is a main pattern, Manhattanization and fracturing are performed. If the pattern is an assist feature, the fracturing templates are used.

In some embodiments, the flow of FIG. 11 can be performed using a computer based EDA system 1100. This flow provides fast template-based curvilinear mask data preparation for the assist features while performing individual fracturing computations for each main pattern or pattern segment. Thus, the flow of FIG. 11 can be performed more quickly than performing Manhattanization and fracturing for all the assist features, even in the case where the foundry wishes to maintain the accuracy of Manhattanization and fracturing for the main patterns, or the main patterns include features which are not currently available in the particular fracturing library being used.

Block 110 is the layout design provided by an IC designer, as described above.

Block 1120 is a computer implemented system, which can be a computer programmed with an EDA tool having a computational lithography platform, such as "INVERSE EXPLORER" by SYNOPSYS of Mountain View, Calif. Block 1120 adds curvilinear assist features on the layout 110. The output of block 1120 is a set of ideal curvilinear assist feature patterns and original main patterns.

Block 1130 is a converter that converts the ideal curvilinear assist feature patterns to a set of fracture templates. Block 1130 includes a matching component for recognizing and classifying segments of patterns as being approximately the same as respective previously defined fracturing templates stored in a fracturing template library 190. (In this example, block 1130 only performs fracturing template matching for the assist features, and not for the main patterns); and (2) a substitution component for replacing assist features of the curvilinear mask layout with one or more previously stored fracturing template having approximately the same shape as the patterns, to form a fractured IC layout.

Block 1140 performs OPC for the main patterns, using the OPC model 122.

Block 1150 Manhattanization and fracturing for the main patterns. This function can be performed by the computational lithography platform of the EDA tool.

Block 150 assembles the e-beam file for fabricating a photomask using an e-beam writer, such as a variable shaped beam (VSB) writer.

Block 160 is formation of a photomask 161 using an e-beam writer.

Figure 12:
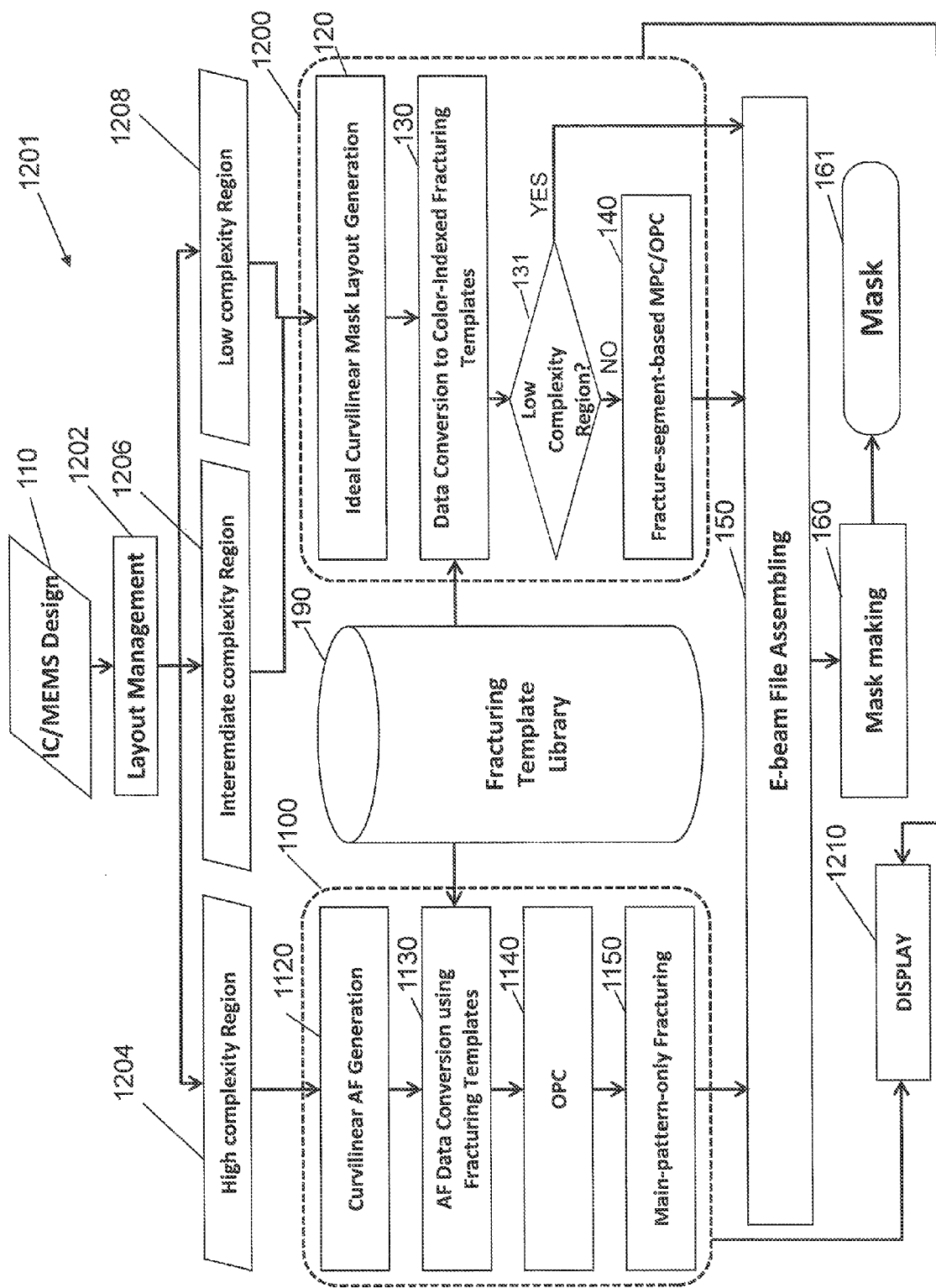
FIG. 12 is a block diagram of a system for performing the process flows of FIGS. 1, 10 and 11.

FIG. 12 is a block diagram of a system 1201 capable of performing any of the flows shown in FIGS. 1, 10 and 11, as well as an additional hybrid process flow which can be performed using this system. The system 1201 of FIG. 12 provides the capability to use the fast template matching and substitution of FIG. 10 (without performing Manhattanization and fracturing for each individual pattern or pattern segment) if the main patterns are of normal complexity and can all be represented by fracturing templates in the fracturing template library 190. System 1201 also provides the capability to use the fast template matching and substitution of FIG. 11 for the assist features, while performing Manhattanization and fracturing for each individual main pattern if the main patterns are of greater complexity. For layouts which include a combination of low and intermediate complexity patterns, the system 1201 provides the capability to use fast template matching and substitution for all patterns, and to skip MPC/OPC for the lowest complexity patterns.

System 1201 divides the plurality of main patterns into a first group and a second group. Each respective one of the main patterns in the first group (e.g., low or intermediate complexity patterns) is dispatched to block 1200, where they are replaced with one or more fracturing templates so as to provide approximately the same shape as the respective main pattern of the curvilinear mask layout. For the low complexity patterns in the first group, fracture-segment based MPC/OPC can be skipped without substantial effect on accuracy. Meanwhile, after conversion to fracturing templates, each respective one of the main patterns of intermediate complexity in the first group is subjected to fracture segment based MPC and OPC. For the second (high complexity) group, OPC and fracturing are performed for the main patterns and the assist features are converted to fracturing templates. The assignment of patterns to the first and second groups can be based on the user's criteria. For example, the patterns can be assigned to the first and second groups based on complexity.

The tool component 1100, design 110, fracturing template library 190, e-beam file assembling 150 and mask making 160 in FIG. 12 can be the same as those described above with reference to FIGS. 1 and 11, respectively, and the descriptions of these functions are not repeated. Block 1200 performs a hybrid method, in which the fracturing templates are used for all patterns (as in FIG. 1), but MPC/OPC are only applied selectively to intermediate complexity patterns. The block 1200 performs the steps of ideal curvilinear mask layout generation 120 and data conversion to color indexed fracturing templates 130 as described above with reference to FIGS. 1 and 10. At decision block 131, a determination is made whether each individual pattern has low or intermediate complexity. If the pattern has low complexity, e-beam file assembling step 150, as described above with reference to FIGS. 1 and 10, is performed next. If the pattern has intermediate complexity, the fracture-segment based MPC/OPC is performed at step 140, in the manner described above with reference to FIG. 1, and then step 150 is performed. In some embodiments, each of the blocks 1100 and 1200 are included in the same computer. In other embodiments, the function s of blocks 1100 and 1200 are distributed among two or more computers.

The system 1201 of FIG. 12 adds a layout management block 1202, which identifies regions of interest (e.g., dense pattern regions) and evaluates the circuit patterns in these regions. Regions only containing circuit patterns which are simple rectangles and squares are designated simple regions, and are dispatched to the low complexity region handling block 1208, for processing by the flow of FIG. 10. Regions of intermediate complexity are dispatched to the intermediate complexity region handling block 1206, which subjects them to curvilinear mask layout generation 120, fracturing template conversion 130 and fracture-segment-based MPC/OPC 140, as in FIG. 1, Regions containing circuit patterns which are complex polygons are designated complex regions, and are dispatched to the high complexity region handling block 1204, for processing by the flow of FIG. 11.

FIG. 12 also shows the outputs of the mask data generation system being transmitted to a display device 1210. As described above with reference to FIGS. 6 and 7, each main pattern type and each assist feature type can be represented by a different color, and the results displayed on the display device 1210. This assists the user in quickly determining what types of fracturing templates have substituted for the ideal curvilinear mask patterns.

In some embodiments, a method comprises: (a) transforming a layout of a layer of a device to a curvilinear mask layout; (b) replacing at least one pattern of the curvilinear mask layout with a previously stored fracturing template having approximately the same shape as the pattern, to form a fractured device layout; and (c) storing, in a non-transitory storage medium, an e-beam generation file including a representation of the fractured device layout, to be used for fabricating a photomask.

In some embodiments, a non-transitory, computer readable storage medium is encoded with computer program code, such that when a computer executes the computer program code, the computer performs a method comprising: (a) transforming a layout of a layer of a device to a curvilinear mask layout; (b) replacing at least one pattern of the curvilinear mask layout with a previously stored fracturing template having approximately the same shape as the pattern, to form a fractured device layout; and (c) storing, in a non-transitory storage medium, an e-beam generation file including a representation of the fractured device layout, to be used for fabricating a photomask.

In some embodiments, a system comprises one or more non-transitory, computer readable storage media containing a layout of a layer of a device and at least one fracturing template. A computer processor is configured to: (a) transform the layout of the layer of the IC or MEMS to a curvilinear mask layout; (b) replace at least one pattern of the curvilinear mask layout with a previously stored fracturing template having approximately the same shape as the pattern, to form a fractured device layout; and (c) store, in one of the one or more non-transitory, computer readable storage media, an e-beam generation file including a representation of the fractured device layout, to be used for fabricating a photomask.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method, comprising:
(a) using a computer to transform a layout of a layer of a device to a mask layout having a plurality of main patterns and a plurality of assist features for patterning the layout on a resist;
(b) determining a pattern type of at least one of the main patterns;
(c) determining a pattern angle for the at least one main pattern;
(d) selecting a previously stored fracturing template corresponding to the determined pattern type and pattern angle from a fracturing template library, wherein the fracturing template library is indexed by pattern type and pattern angle; and
(e) replacing the at least one main pattern with the selected fracturing template, so as to provide approximately the same shape as the at least one main pattern of the mask layout;
(f) storing, in a non-transitory storage medium, an e-beam generation file including a representation of the layout after the replacing, to be used for fabricating a photomask.

2. The method of claim 1, wherein step (d) includes:
(d1) comparing the pattern to a plurality of previously stored fracturing templates stored in the fracturing template library; and
(d2) selecting one or more of the plurality of previously stored fracturing templates which, alone or in combination, most closely resembles the pattern, to be used to replace the pattern.

3. The method of claim 2, wherein:
the fracturing template library contains main patterns and assist features;
the main patterns correspond to circuit patterns to be patterned on a layer of an IC; and
the assist features correspond to patterns to be formed on a photomask used to form the layer of the IC, but the assist features are not to be patterned on the layer of the IC.

4. The method of claim 3, wherein:
step (e) includes replacing each respective one of the plurality of the assist features of the mask layout with one or more fracturing templates so as to provide approximately the same shape as the respective assist feature of the mask layout.

5. The method of claim 2, wherein:
the step of selecting one or more of the plurality of previously stored fracturing templates is performed for the plurality of assist features.

6. The method of claim 1, wherein the fracturing template includes a plurality of abutting or overlapping patterns corresponding to a Manhattanized representation of a circuit pattern segment.

7. The method of claim 1, further comprising:
dividing the plurality of main patterns into a first group and a second group before step (b), such that the at least one main pattern is included in the first group, and the main patterns in the second group are more complex than the main patterns in the first group; and
performing optical proximity correction and fracturing for the main patterns of the second group, without using the fracturing templates.

8. A non-transitory, computer readable storage medium encoded with computer program code, such that when a computer executes the computer program code, the computer performs a method comprising:
(a) transforming a layout of a layer of a device to a mask layout having a plurality of main patterns and a plurality of assist features for patterning the layout on a resist;
(b) determining a pattern type of at least one of the main patterns;
(c) determining a pattern angle for the at least one main pattern;
(d) selecting a previously stored fracturing template corresponding to the determined pattern type and pattern angle from a fracturing template library, wherein the fracturing template library is indexed by pattern type and pattern angle; and
(e) replacing the at least one main pattern with the selected fracturing template, so as to provide approximately the same shape as the at least one main pattern of the mask layout;
(f) storing, in a non-transitory storage medium, an e-beam generation file including a representation of the layout after the replacing, to be used for fabricating a photomask.

9. The non-transitory, computer readable storage medium of claim 8, wherein, step (d) includes:
(d1) comparing the pattern to a plurality of previously stored fracturing templates stored in the fracturing template library; and
(d2) selecting one of the plurality of previously stored fracturing templates which most closely resembles the pattern, to be used to replace the pattern.

10. The non-transitory, computer readable storage medium of claim 9, wherein:
the fracturing template library contains main patterns and assist features;
the main patterns correspond to circuit patterns to be patterned on a layer of an IC;
the assist features correspond to patterns to be formed on a photomask used to form the layer of the IC, but the assist features are not to be patterned on the layer of the IC;
the mask layout has a plurality of assist features; and
step (e) includes replacing each respective one of the plurality of the assist features of the curvilinear mask layout with one or more fracturing templates so as to provide approximately the same shape as the respective assist feature of the mask layout.

11. The non-transitory, computer readable storage medium of claim 10, wherein:
the method further comprises performing one of mask process correction and optical proximity correction on the representation of the layout after the replacing.

12. The non-transitory, computer readable storage medium of claim 8, wherein the method further comprises:
dividing the plurality of main patterns into a first group and a second group before step (b), such that the at least one main pattern is included in the first group, and the main patterns in the second group are more complex than the main patterns in the first group; and
performing optical proximity correction and fracturing for the main patterns of the second group, without using the fracturing templates.

13. A system comprising:
one or more non-transitory, computer readable storage media containing:
a layout of a layer of a device and a fracturing template library containing at least one fracturing template; and
a computer processor configured to:
(a) transform the layout of the layer of the device to a mask layout having a plurality of main patterns and a plurality of assist features for patterning the layout on a resist;
(b) determine a pattern type of at least one of the main patterns;
(c) determine a pattern angle for the at least one main pattern;
(d) select a previously stored fracturing template corresponding to the determined pattern type and pattern angle from a fracturing template library, wherein the fracturing template library is indexed by pattern type and pattern angle; and
(e) replace the at least one main pattern with the selected fracturing template, so as to provide approximately the same shape as the at least one main pattern of the mask layout;
(f) store, in one of the one or more non-transitory, computer readable storage media, an e-beam generation file including a representation of the layout after step (e), to be used for fabricating a photomask.

14. The system of claim 13, wherein the fracturing template library includes a plurality of fracturing templates, and the computer is configured to perform, before step (c):
(d1) comparing the pattern to the plurality of fracturing templates in the fracturing template library; and
(d2) selecting one or more of the plurality of previously stored fracturing templates which, alone or in combination, most closely resembles the pattern, to be used to replace the pattern.

15. The system of claim 14, wherein each fracturing template includes a plurality of abutting or overlapping patterns corresponding to a Manhattanized representation of a circuit pattern segment.

16. The system of claim 14, wherein:
the plurality of fracturing templates are classified based on at least one of the group consisting of function, shape, angle, length, position and neighbor projection, and
the computer processor is configured to access the fracturing templates based on their classifications.

17. The system of claim 14, wherein the processor is configured for identifying regions of interest and evaluating complexity of circuit patterns in the regions of interest.

18. The system of claim 17, wherein the processor is configured for assigning a region that only contains circuit patterns which are rectangles and squares to the first group.

19. The system of claim 13, wherein the processor is further configured to:
   divide the plurality of main patterns into a first group and a second group before step (b), such that the at least one main pattern is included in the first group, and the main patterns in the second group are more complex than the main patterns in the first group; and
   perform optical proximity correction and fracturing for the main patterns of the second group, without using the fracturing templates.

* * * * *